United States Patent
Kwon et al.

(10) Patent No.: US 9,705,046 B2
(45) Date of Patent: Jul. 11, 2017

(54) LIGHT EMITTING APPARATUS

(71) Applicant: LG INNOTEK CO., LTD., Seoul (KR)

(72) Inventors: Ji Na Kwon, Seoul (KR); Ho Ki Kwon, Seoul (KR); Jeong Hyun Na, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/621,757

(22) Filed: Feb. 13, 2015

(65) Prior Publication Data

US 2015/0236217 A1   Aug. 20, 2015

(30) Foreign Application Priority Data

Feb. 17, 2014   (KR) .................. 10-2014-0018140

(51) Int. Cl.
   *H01L 29/18*   (2006.01)
   *H01L 33/00*   (2010.01)
   *H01L 33/48*   (2010.01)
   *H01L 27/15*   (2006.01)
   *H01L 33/62*   (2010.01)

(52) U.S. Cl.
   CPC .......... *H01L 33/483* (2013.01); *H01L 27/156* (2013.01); *H01L 33/62* (2013.01)

(58) Field of Classification Search
   CPC ....... H01L 2924/00; H01L 2224/83192; H01L 2924/12041; H01L 21/563; H01L 2224/8385; H01L 24/73; H01L 2924/01079; H01L 2924/14; H01L 2924/01078; H01L 2924/01029; H01L 2924/01013; H01L 24/83; H01L 33/483; H01L 27/156

USPC .... 257/782, 88, 753, 783, 778; 438/118, 25, 438/26, 51, 55, 64, 106
See application file for complete search history.

(56) References Cited

U.S. PATENT DOCUMENTS

| | | | |
|---|---|---|---|
| 5,527,578 A | 6/1996 | Mazurek et al. | |
| 2003/0098440 A1* | 5/2003 | Musa et al. | 252/182.13 |
| 2003/0161976 A1* | 8/2003 | Rea et al. | 428/35.7 |
| 2005/0191456 A1* | 9/2005 | Hashimoto et al. | 428/40.1 |
| 2005/0263907 A1* | 12/2005 | Yamano | 257/782 |
| 2007/0189011 A1 | 8/2007 | Song et al. | |
| 2008/0097010 A1* | 4/2008 | Kuroda | C08G 59/245 523/451 |
| 2008/0265386 A1* | 10/2008 | Muto et al. | 257/676 |
| 2009/0261374 A1* | 10/2009 | Hayashi | 257/99 |
| 2010/0068515 A1* | 3/2010 | Paul et al. | 428/355 AC |
| 2010/0079059 A1 | 4/2010 | Roberts et al. | |

(Continued)

FOREIGN PATENT DOCUMENTS

| | | | | |
|---|---|---|---|---|
| KR | 10-2012-0032180 A | | 4/2012 | |
| KR | 20130046532 | * | 5/2013 | 257/798 |
| KR | 10-2013-0110873 A | | 10/2013 | |

*Primary Examiner* — Thao X Le
*Assistant Examiner* — Nduka Ojeh
(74) *Attorney, Agent, or Firm* — Birch, Stewart, Kolasch & Birch, LLP (57) ABSTRACT

Disclosed is a light emitting apparatus which includes at least one light emitting device; a substrate under the light emitting device; a bonding member between the light emitting device and the substrate; and an adhesion member under the substrate, wherein the adhesion member includes at least one of benzotriazole and hydroxy group.

20 Claims, 8 Drawing Sheets

(56) References Cited

U.S. PATENT DOCUMENTS

| | | | |
|---|---|---|---|
| 2010/0304162 A1* | 12/2010 | Chong et al. | 428/469 |
| 2011/0103061 A1* | 5/2011 | Kim | F21K 9/00 362/249.02 |
| 2011/0149198 A1* | 6/2011 | Kim et al. | 349/58 |
| 2011/0280003 A1* | 11/2011 | Hsu | G02F 1/133603 362/97.1 |
| 2012/0033447 A1* | 2/2012 | Hashino | G02B 6/0086 362/612 |
| 2012/0138974 A1* | 6/2012 | Yoo | H01L 33/486 257/88 |
| 2012/0193773 A1 | 8/2012 | Kapadia | |
| 2012/0248634 A1* | 10/2012 | Mitsukura et al. | 257/798 |
| 2013/0153938 A1* | 6/2013 | Grajcar | F21V 29/58 257/88 |
| 2013/0217813 A1 | 8/2013 | Lee et al. | |

* cited by examiner

Acrylic acid          Acid capture

| Component | Detection component | Comparative example | Embodiment 1 | Embodiment 2 |
|---|---|---|---|---|
| | ethyl acetate | | 2.502E+08 | 3.362E+08 |
| | 2-Chloroethanol | | | 3.850E+08 |
| | 1,2-Ethanediol | | | 1.722E+07 |
| | Cyclohexane | | 1.064E+07 | |
| | Toluene | 6.07E+07 | 1.612E+09 | 1.802E+08 |
| AA | Acrylic acid | 5.25E+08 | 4.756E+08 | |
| HEA | 2-Hydroxyethyl acetate | | | 6.856E+08 |
| HEA | 2-Hydroxyethyl acetate | | | 1.204E+10 |
| | total HEA | | | 1.273E+10 |
| IBOA | Camphene | | 5.392E+08 | 1.391E+09 |
| IBOA | Cyclohexene, 4-methyl-1-(1-methylethyl)- | | | 1.188E+09 |
| IBOA | Benzene, 1-methyl-2-(1-methylethyl)- | | | 2.560E+09 |
| IBOA | Isobornyl formate | | | 1.770E+09 |
| IBOA | Neoisothujyl alcohol | | | 2.216E+10 |
| | total IBOA | | 5.392E+08 | 2.907E+10 |
| EHA | 2-Ethyl-1-hexanol | 1.97E+09 | 3.287E+09 | 5.227E+08 |
| EHA | 2-Ethylhexyl acetate | 3.46E+09 | 2.281E+09 | 1.933E+09 |
| EHA | 2-Ethylhexyl acrylate | 1.39E+10 | 7.437E+08 | 3.322E+10 |
| EHA | 2-ethyl-1-hexyl propionate | 1.62E+09 | 1.243E+09 | |
| | total HEA | | 2.076E+10 | 3.568E+10 |
| | Benzoic acid, 2,4,6-trimethyl- | | 4.805E+08 | |
| | 2-Ethyl-1,4-benzodioxin | | | 2.573E+08 |
| | total VOC area/g | | 2.515E+10 | 9.637E+10 |

LIGHT EMITTING APPARATUS

CROSS-REFERENCE TO RELATED APPLICATION

This application claims under 35 U.S.C. §119 to Korean Patent Application No. 10-2014-0018140 (filed on Feb. 17, 2014), which is hereby incorporated by reference in its entirety.

BACKGROUND

The embodiment relates to a light emitting apparatus.

A light emitting device is a device to convert electrical energy into light energy. The light emitting device includes a light emitting diode (LED) and a laser diode (LD). For example, the light emitting device may represent various colors by adjusting the compositional ratio of compound semiconductors.

The light emitting device may constitute a light emitting source realized by using GaAs, AlGaAs, GaN, InGaN, and InGaAlP-based compound semiconductor materials.

The light emitting device is packaged through a molding member, so that the light emitting device may be realized in the form of a light emitting device package to represent various colors, and the light emitting device package has been applied to various fields such as a lighting indicator, a character indicator, an image indicator, and a lighting device to represent colors.

Since the molding member has gas permeability, the molding member can't perfectly block the gas introduced from an outside, so that the metal in the light emitting device package may be exposed to external gas. When the metal exposed to external gas is corroded, the corroded metal causes the luminous intensity to be decreased. In addition, when the light emitting device is exposed to various environmental conditions such as various temperatures and humidities or the gas generated from a used material exerts an influence on the metal, the metal may be corroded.

BRIEF SUMMARY

The embodiment provides a light emitting apparatus including an adhesion member having hydroxy group (—OH) or benzotriazole (BTA).

The embodiment provides a light emitting apparatus including an adhesion member having hydroxy group (—OH) or benzotriazole (BTA) on a substrate adjacent to a light emitting device.

The embodiment provides a light emitting apparatus including an adhesion member having an acid capture material or an acid free material on a substrate adjacent to a light emitting device.

According to the embodiment, there is provided a light emitting apparatus including: at least one light emitting device; a substrate under the light emitting device; a bonding member between the light emitting device and the substrate; and an adhesion member under the substrate, wherein the adhesion member includes at least one of benzotriazole and hydroxy group.

According to the embodiment, there is provided a light emitting apparatus including: a plurality of light emitting devices including a body, a plurality of electrodes on the body, a light emitting chip on at least one of the electrodes, and a molding member on the light emitting chip; a substrate disposed under the light emitting devices and electrically connected to the light emitting device; and an adhesion member including a first adhesive layer under the substrate and a base layer under the first adhesive layer, wherein the first adhesive layer includes one of benzotriazole and hydroxy group.

DETAILED DESCRIPTION OF THE EMBODIMENTS

In the description of embodiments, it will be understood that when layers (or films), regions, patterns, or structures are referred to as being 'on'/'under' other layers (films), regions, pads, or patterns, respectively, they can be directly 'on'/'under' other layers (films), regions, pads, or patterns, respectively, or intervening layers (films), regions, pads, or patterns may also be present. In addition, such a position of each layer has been described with reference to the drawings.

Hereinafter, a light emitting apparatus according to the embodiment will be described in detail with reference to accompanying drawings.

Figure 1:
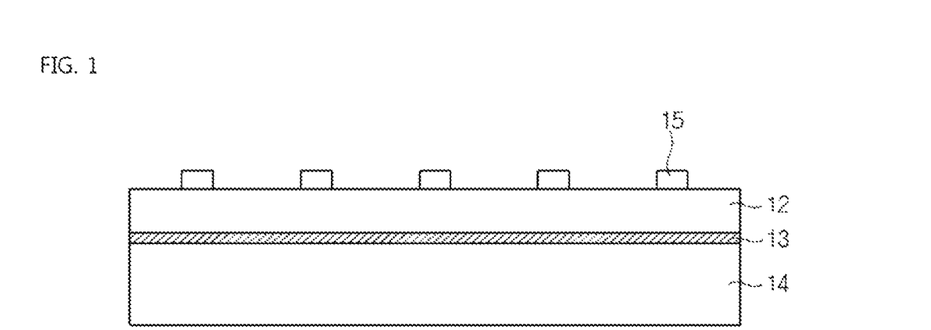
FIG. 1 is a view showing a light emitting apparatus according to the embodiment.
Figure 2:
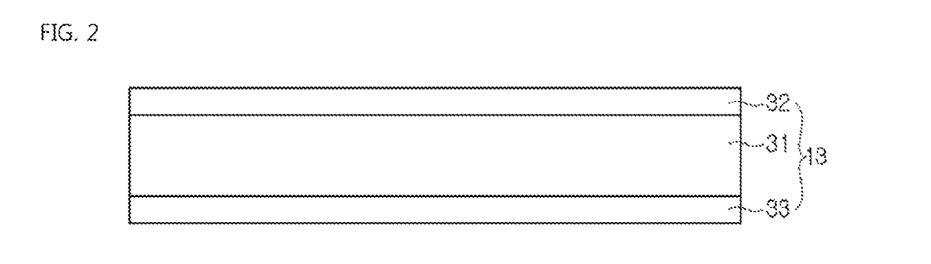
FIG. 2 is a view showing an example of the adhesion member of the light emitting apparatus of FIG. 1.
Figure 3:
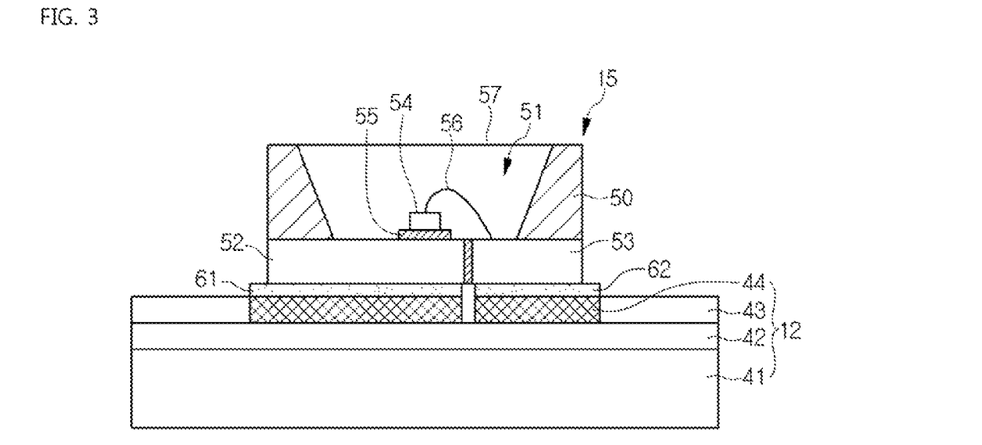
FIG. 3 is a view showing the light emitting device and the substrate of FIG. 1.

FIG. 1 is a view showing a light emitting apparatus according to the embodiment. FIG. 2 is a view showing an example of the adhesion member of the light emitting apparatus of FIG. 1. FIG. 3 is a view showing the light emitting device and the substrate of FIG. 1.

Referring to FIGS. 1 to 3, a light emitting apparatus includes a substrate 12, a support member 14 under the substrate 12, an adhesion member 13 between the substrate 12 and the support member 14, and a plurality of light emitting devices 15 on the substrate 12.

Referring to FIG. 3, the substrate 12 is electrically connected to the light emitting device 15 through a bonding member 61 and 62. The substrate 12 includes a support layer 41, an insulating layer 42, a circuit pattern 44 and a protective layer 43. The support layer 41 may include a metal layer. The metal layer has a thickness of 60% or more with respect to the thickness of the substrate 12 and may be formed of a material having high thermal conductivity. The insulating layer 42 may insulate the circuit pattern 44 from the support layer 41 and include a material such as $SiO_2$, $TiO_2$, $SiO_x$, $SiO_xN_y$, $S_3N_4$, or $Al_2O_3$. The circuit pattern 44 includes a plurality of pads connected to the light emitting device 15 and is connected to the bonding member 61 and 62. The circuit pattern 44 may be connected in parallel and/or series to the light emitting devices 15. The protective layer 43, which serves as a layer for protecting the circuit pattern 44, may be defined by a solder resist layer, but the embodiment is not limited thereto. The substrate 12 may be formed of one of a resin based PCB (Printed Circuit Board), a metal core PCB (MCPCB) and a flexible PCB (FPCB).

The adhesion member 13 may adhere to the substrate 12 and the support member 14 while being interposed between the substrate 12 and the support member 14. The adhesion member 13 may include a bonding tape or an adhesive tape, and may be formed of a material having high thermal conductivity. As shown in FIG. 2, the adhesion member 13 includes a base layer 31 and an adhesive layers 32 and 33. The base layer 31, which supports the adhesion member 13, may be formed of a resin material or a polymer material. The adhesive layers 32 and 33 are disposed on one of top and bottom surfaces of the base layer 31 or both top and bottom surfaces of the base layer 31, so that the adhesive layers 32 and 33 may be adhered between the substrate 12 and the support member 14. According to the embodiment, at least one of the adhesive layers 32 and 33 and the base layer 31 may include an acid capture material or an acid free material. The acid capture material may include benzotriazole (BTA) and the benzotriazole may be formed by allowing an acid component to react with the benzotriazole component.

Instead of acrylic acid, a material such as hydroxy group, in which —COOH is replaced with —OH, may be added to the acid free material. A hydroxyethyl acrylate (HEA) material or a 2-hydroxethyl acetate (HEA) material may be added to the hydroxy group. The hydroxy group may be operated as an adhesive and the adhesion member having the hydroxy group may be formed of an acid free material.

The support member 14 may be a bottom cover which receives, for example, a part of a display device and a heat dissipation plate. The bottom cover or heat dissipation plate may include a metallic material, but the embodiment is not limited thereto.

The light emitting device 15 may include a body 50, a plurality of electrodes 52 and 53, a paste member 55 and a molding member 57.

The body 50 may include one selected from an insulating material, a transmittance material and a conductive material. For example, the body 50 may be formed of at least one of a resin material such as polyphthalamide (PPA), silicon (Si), a metallic material, photo sensitive glass (PSG), sapphire ($Al_2O_3$), epoxy molding compound (EMC), polymer group, and a plastic based printed circuit board (PCB). For example, the body 50 may be formed of one selected from a resin material such as polyphthalamide (PPA), silicon and epoxy based material. The body 50 may have a polygonal shape, a circular shape or a shape having a curved surface when viewed from the top, but the embodiment is not limited thereto.

The body 50 may include a cavity 51 which are provided with an opened upper portion and a peripheral portion having inclined surfaces. For example, at least two electrodes 52 and 53 may be disposed on a bottom surface of the cavity 51. The electrodes 52 and 53 may be spaced apart from each other on the bottom surface of the cavity 51. The cavity 51 may have a lower portion having a wider width than that of an upper portion, but the embodiment is not limited thereto.

The electrodes 52 and 53 may include a metallic material, for example, at least one of titanium (Ti), copper (Cu), nickel (Ni), gold (Au), chrome (Cr), tantalum (Ta), platinum (Pt), tin (Sn), silver (Ag), and phosphor (P), and may be configured as a single metal layer or multi-metal layers. When the surfaces of the electrodes 52 and 53 having silver are exposed, the embodiment may prevent the surfaces from being discolored.

A gap part between the electrodes 52 and 53 may be formed of an insulating material which is equal to or different from that of the body 50, but the embodiment is not limited thereto.

The light emitting chip 54 may be disposed on at least one of the electrodes 52 and 53. The light emitting chip 54 may be bonded or flip-bonded to at least one of the electrodes 52 and 53 by using the paste member 55. The paste member 55 may include a paste material including silver.

The light emitting chip 54 may selectively emit light in the range between a visible light wavelength and an ultraviolet (UV) wavelength. For example, the light emitting chip 54 may be selected from a red LED chip, a blue LED chip, a green LED chip, a yellow green LED chip, a UV LED chip and a white LED chip. The light emitting chip 54 includes a compound semiconductor of group III-V elements and/or group II-VI elements. Although the light emitting chip 54 is disposed in a chip structure having a lateral type electrode structure in the embodiment, the light emitting chip 54 may disposed in a chip structure having a vertical type electrode structure in which two electrodes are disposed in the vertical direction. The light emitting chip 54 is electrically connected to a plurality of electrodes 52 and 53 through an electrical connection member such as a wire 56.

At least one light emitting chip 54 may be disposed in the cavity 51. At least two light emitting chips may be connected in parallel or series to each other, but the embodiment is not limited thereto.

The molding member 57 having a resin material may be formed in the cavity 51. The molding member 57 may include a transparent material such as silicon or epoxy and may be formed in a single layer or a multilayer structure. A top surface of the molding member 57 may include at least one of a flat shape, a concave shape and a convex shape. For example, the top surface of the molding member 57 may be concave or convex and may serve as a light emitting surface of the light emitting chip 54.

The molding member 57 may include phosphor for converting a wavelength of light emitted from the light emitting chip 54 which is included in a resin material such as silicon or epoxy. The phosphor may include one selected from YAG, TAG, silicate, nitride, and oxy-nitride-based materials. The phosphorus material may include at least one of red phosphor, yellow phosphor and green phosphor, but the embodiment is not limited thereto.

An optical lens (not shown) may be provided on the molding member 57 and may be formed of a transparent material having a refractive index in the range of 1.4 to 1.7. In addition, the optical lens may include a transparent resin material such as poly methacrylic acid methyl (PMMA) having the refractive index of 1.49, polycarbonate having the refractive index of 1.59, and epoxy resin (EP), or a transparent glass.

Meanwhile, various materials may be applied when the body 50 and the molding member 57 are realized. As the light emitting chip 54 is driven for a long time, a metallic part, such as silver paste or a silver coating layer, which is a part of the paste member 55 applied to the electrodes used in the light emitting device 15, may be discolored. It is analyzed that the metallic part is discolored because acid included in a thermal tape adhesive between the substrate 12 and the support member 14 penetrates the molding member 57 to exert an influence on the metallic part. Accordingly, the present embodiment suggests a scheme of preventing the acid material contained in the adhesion member 13 from exerting an influence on the metallic part of the light emitting device 15 to discolor the metallic part.

In this case, an acrylic acid material may be used for the adhesion member 13 to enhance the adhesive strength. When the acrylic acid material exists in the adhesion member 13, oxidation from —COOH ions to OH— ions occurs on a surface of the metallic part, so that an oxide layer (scale) is formed on the surface of the metallic part, thereby discoloring the metallic part. In addition, according to the analysis, activated metal (for example, Ag) and hydroxide are formed due to the dissociation of —COOH ions to OH— ions or the dissociation (of $H^+$ to OH—) of water molecules permeated into an interface under a high humidity environment. Thus, the metallic part is discolored and the luminous intensify is degraded.

The adhesion member 13 may include an acid capture material or an acid free material. For example, the acid capture material may include benzotriazole (BTA) and the acid free material may include hydroxy group. Thus, the acid capture material added to the adhesion member 13 may prevent the acrylic acid added into the adhesion member 13 from being discharged in gas. In addition, the hydroxy group may prevent an element material of the light emitting device 15 such as a metallic material from being discolored by acid. By allowing at least one of the acid capture material and the hydroxy group to be included in the adhesion member 13, an element material of the light emitting device 15 may be prevented from being discolored, so that the luminous intensity of the light emitting device 15 may be prevented from being degraded.

According to the embodiment, the acid capture material or the acid free material is provided to a material existing between the support member 14 and the light emitting chip 54, so that the discoloration of metal contained in the light emitting device 15 may be reduced. Thus, the luminous intensity may be prevented from being degraded due to hours of use.

According to another embodiment, there is suggested a scheme of preventing the acid material contained in the body 50 from reacting with the metallic material included in the light emitting device 15 to discolor the metallic material. The benzotriazole or hydroxy group is disposed in a region between the body 50 and the paste member 55, so that acid may be prevented from being generated in the light emitting device 15 and the generated acid may be removed.

Figure 4:
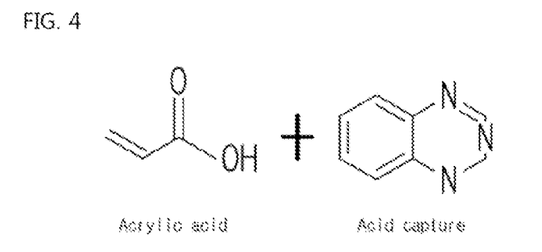
FIG. 4 is a view illustrating the forming of acrylic acid and benzotriazole reactant in the light emitting apparatus of FIG. 1.

FIG. 4 is a view illustrating the forming of acrylic acid and benzotriazole reactant in the light emitting apparatus of FIG. 1. The benzotriazole reactant reacts with the acrylic acid, so that any acid materials are prevented from being generated.

Figure 5:
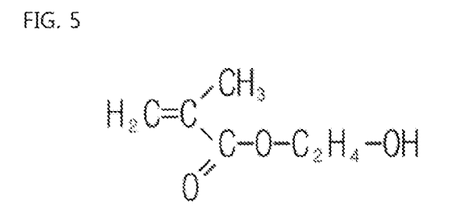
FIG. 5 is a view illustrating the forming of hydroxy group reactant as an acid free material in the light emitting apparatus of FIG. 1.

FIG. 5 is a view illustrating the forming of hydroxy group reactant as an acid free material in the light emitting apparatus of FIG. 1. Instead of the acrylic acid, a material in which —COOH is replaced with hydroxyl group (—OH) may be used as the hydroxy group reactant, so that the adhesive strength may be improved and acid materials may be prevented from being generated. The hydroxy group may include 2-hydroxyethyl acetate or 2-hydroxyethyl acrylate.

Figure 6:
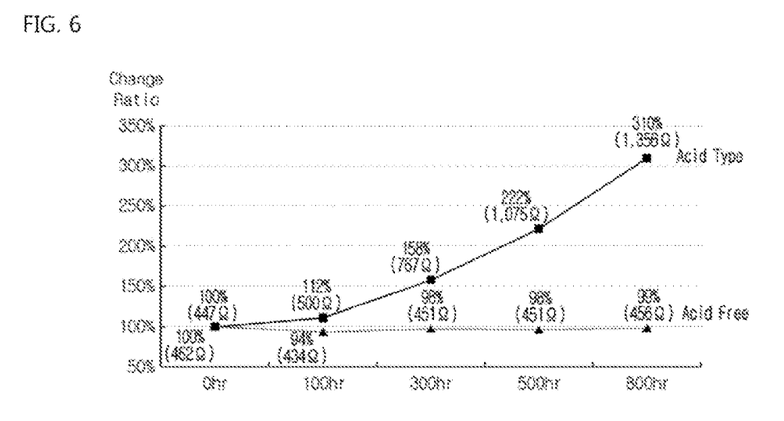
FIG. 6 is a view showing a degree of metal discoloration between acid type and acid free materials of FIG. 5.

FIG. 6 is a view showing a degree of metal discoloration between the acid type and acid free materials of FIG. 5, in which the acid free material rarely causes metal to be discolored and the acid type material causes a metal to be discolored.

Figure 7:
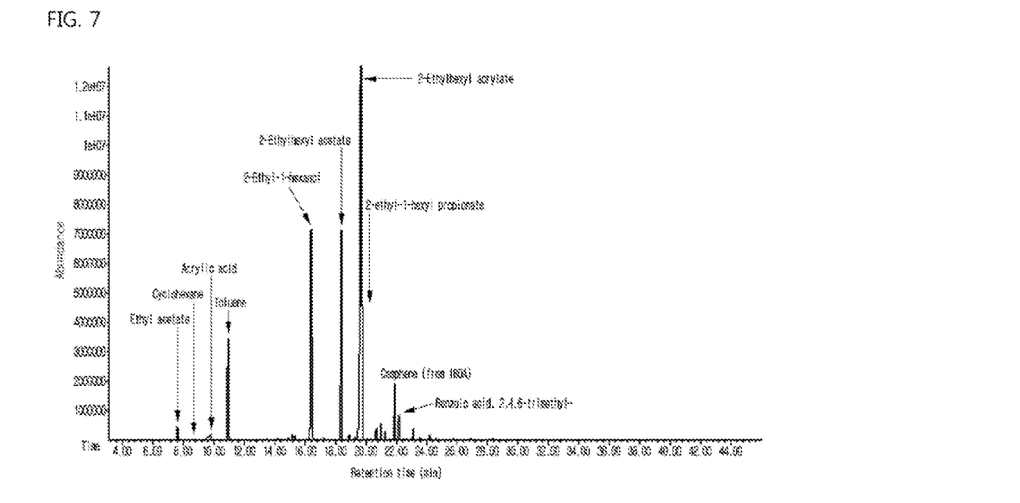
FIG. 7 is a view showing a first example of a sample added to an adhesion member of a light emitting apparatus according to the embodiment.
Figure 8:
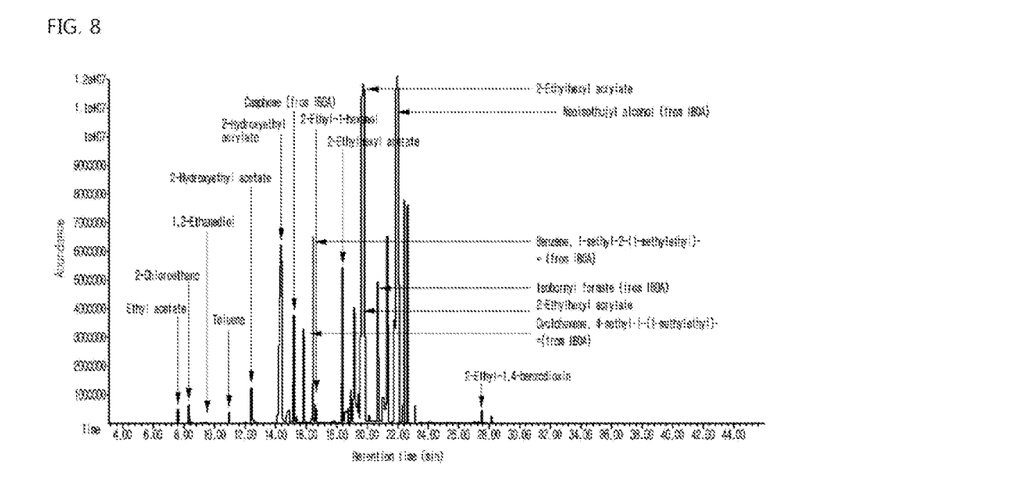
FIG. 8 is a view showing a second example of a sample added to an adhesion member of a light emitting apparatus according to the embodiment.
Figure 9:
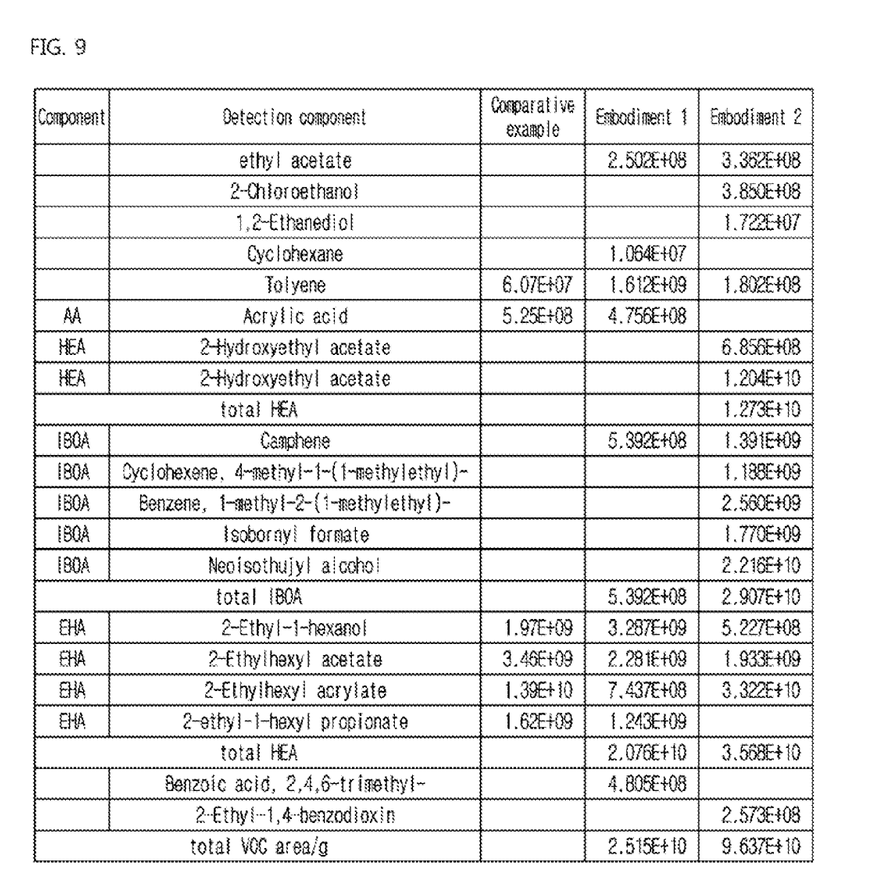
FIG. 9 is a view showing an amount of gas according to a sample of the adhesive tape of FIGS. 7 and 8.

FIGS. 7 to 9 are views showing examples of a sample added to the adhesion member 13 of the light emitting apparatus and amounts of gas according to the embodiment. FIGS. 7 and 8 illustrate the adhesion member 13 including a sample such as benzotriazole or an acid free material according to embodiment 1 or 2, where an amount of an analyzed sample is in the range of 0.04~0.06 and a total peak area may vary with the amount of the analyzed sample, but the embodiment is not limited thereto. The total peak area may be a value of a ratio of charges to mass and an amount of gas may be represented as ppm.

Referring to FIGS. 7 and 9, a sample added to the adhesion member 13 according to the first embodiment may include acrylic acid; 2-ethylhexyl acrylate; 2-ethylehxyl acetate; 2-ethyl-1-hexanol, cyclohexane; ethyl acetate; toluene; 2-ethyl-1-hexyl propionate; camphene; and BTA (Benzoic acid, 2,4,6-trimethyl-). The benzotriazole (BTA) may prevent the acrylic acid from being discharged in gas.

Referring to FIGS. 8 and 9, a sample added to the adhesion member 13 according to the second embodiment may include 2-ethylhexyl acrylate, 2-ethylehxyl acetate; 2-hydroxyethyl acetate, neoisothujyl alcohol; 1,2-ethanedio; 2-hydroxyethyl acrylate; 2-chloroethan, ethyl acetate; toluene; neoisothujyl alcohol (from IBOA); benzene, 1-methyl-2-1 (1-methylethyl) (from IBOA); isobornyl fromate-(from IBOA); 2-ethylhexyl acrylate, cyclohexene, 4-methyl-1-1 (1-methylethyl)-(from IBOA); and 2-Ethyl-1,4-benzodioxin. The adhesion member 13 according to the second embodiment may improve the adhesive strength by using a 2-HEA material instead of acrylic acid and may prevent any acid materials from being generated.

FIG. 9 is a view showing an amount of gas according to GC-MS analysis of a sample of the adhesion member 13 of FIGS. 7 and 8.

Figure 10:
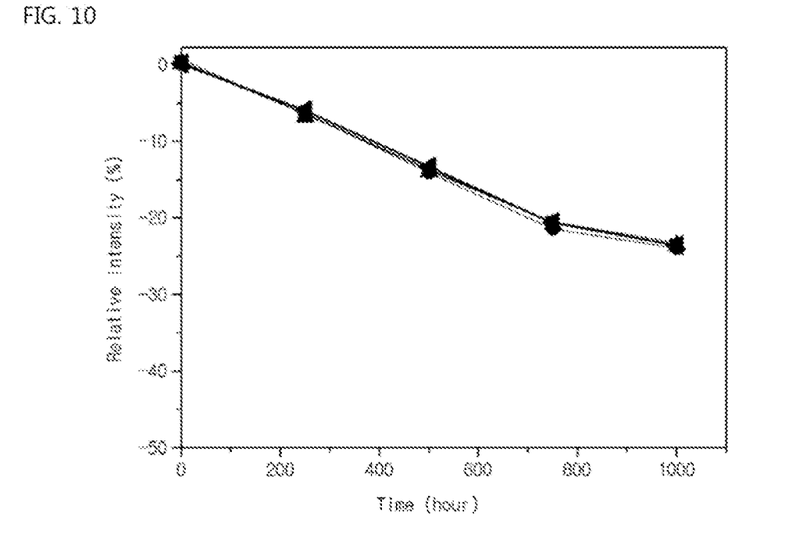
FIG. 10 is a view showing luminous intensity of a light emitting device by a thermal tape in a light emitting apparatus according to a comparative example.
Figure 11:
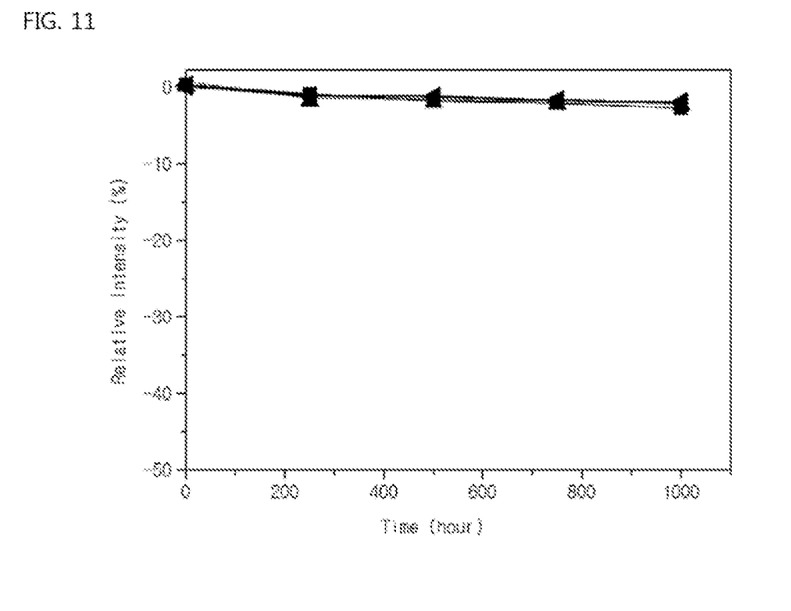
FIG. 11 is a view showing luminous intensity of a light emitting device in a light emitting apparatus having no adhesive tapes according to a comparative example.
Figure 12:
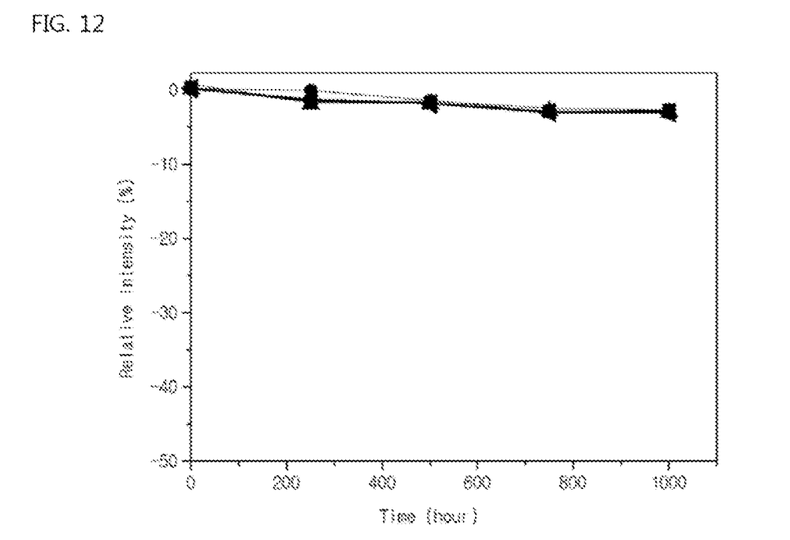
FIG. 12 is a view showing luminous intensity of a light emitting device according to the embodiment by benzotriazole reactant added to the adhesion member of the light emitting apparatus.
Figure 13:
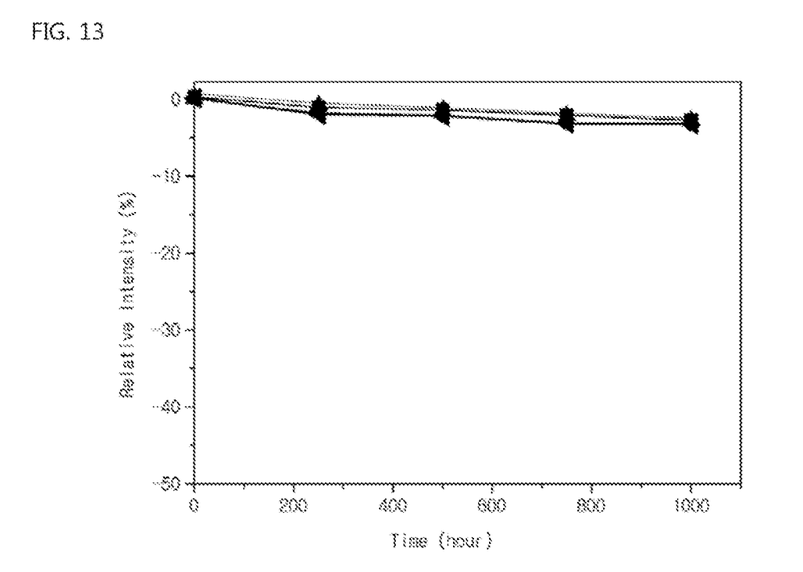
FIG. 13 is a view showing luminous intensity of a light emitting device by an acid free material added to an adhesion member of a light emitting apparatus according to the embodiment.

FIG. 10 is a view showing luminous intensity of a light emitting device as a function of time according to a comparative example when a thermal tape is attached to the light emitting apparatus. FIG. 11 is a view showing luminous intensity of a light emitting device when the light emitting apparatus of FIG. 11 has no adhesive tapes. FIG. 12 is a view showing luminous intensity of a light emitting device according to the embodiment by benzotriazole reactant added to the adhesion member 13 of the light emitting apparatus. FIG. 13 is a view showing luminous intensity of a light emitting device by the acid free material added to the adhesion member 13 of the light emitting apparatus according to the embodiment.

As shown in FIGS. 12 and 13, by removing the acid material generated from the adhesion member 13 adjacent to the light emitting device or preventing the acid material from being generated, the luminous intensity may be prevented from being degraded due to the metal discoloration by the acid generated from the thermal tape of the comparative example shown in FIG. 10.

The light emitting device according to the embodiment may be applied to a lighting system. The lighting system has a structure in which plurality of light emitting devices are arrayed. The lighting system may include a display device shown in FIGS. 14 and 15, a lighting device shown in FIG. 16, a lighting lamp, a signal lamp, a headlight of a vehicle, or an electric signboard.

Figure 14:
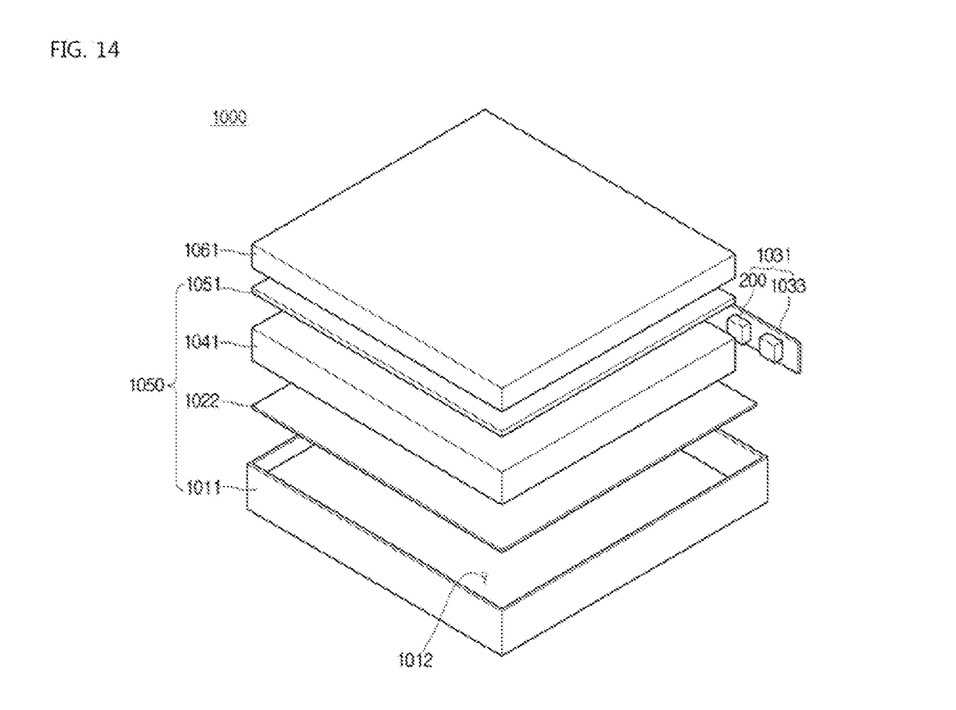
FIG. 14 is a perspective view showing a display device having the light emitting device according to the embodiment.

FIG. 14 is an exploded perspective view showing a display device having the light emitting device according to the embodiment.

Referring to FIG. 14, a display device 1000 according to the embodiment may include a light guide plate 1041, a light emitting module 1031 to supply the light to the light guide plate 1041, a reflective member 1022 provided below the light guide plate 1041, an optical sheet 1051 disposed on the light guide plate 1041, a display panel 1061 disposed on the optical sheet 1051, and a bottom cover 1011 to receive the light guide plate 1041, the light emitting module 1031, and the reflective member 1022, but the embodiment is not limited thereto.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 is disposed in at one side of the light guide plate 1041 to supply the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a substrate 1033 and the light emitting device 200 or the light emitting device package according to the embodiments on the substrate 1033. The light emitting devices 200 are arrayed on the substrate 1033 while being spaced apart from each other by the predetermined interval.

The substrate 1033 may include a printed circuit board (PCB) including a circuit pattern (not shown). In addition, the substrate 1033 may include a metal core PCB (MCPCB) or a flexible PCB (FPCB) as well as a typical PCB, but the embodiment is not limited thereto. If the light emitting device 200 is provided on the side of the bottom cover 1011 or on a heat dissipation plate, the substrate 1033 may be omitted. The heat dissipation plate partially may contact with the top surface of the bottom cover 1011.

In addition, the light emitting devices 200 are arranged on the substrate 1033 such that a light exit surface of the light emitting devices 200 is spaced apart from the light guide plate 1041 by a predetermined interval, but the embodiment is not limited thereto. The light emitting device 200 may directly or indirectly supply the light to a light incident surface, which is one side of the light guide plate 1041, but the embodiment is not limited thereto.

The reflective member 1022 may be provided below the light guide plate 1041. The reflective member 1022 reflects the light, which travels downward through the bottom surface of the light guide plate 1041, upward, thereby improving the brightness of a light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving part 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other and include a transparent material, and a liquid crystal layer disposed between the first and second substrates. A polarizing plate can be attached to at least one surface of the display panel 1061, but the embodiment is not limited thereto. The display panel 1061 displays information by a light passing through an optical sheet 1051. The display apparatus 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one of a diffusion sheet, a horizontal and vertical prism sheet, and a brightness enhanced sheet. The diffusion sheet diffuses the incident light, the horizontal and vertical prism sheet concentrates the incident light onto the display panel, and the brightness enhanced sheet improves the brightness by reusing the lost light. In addition, a protective sheet may be provided on the display panel 1061, but the embodiment is not limited thereto.

The light guide plate 1041 and the optical sheet 1051 can be provided on the light path of the light emitting module 1031 as optical members, but the embodiment is not limited thereto.

Figure 15:
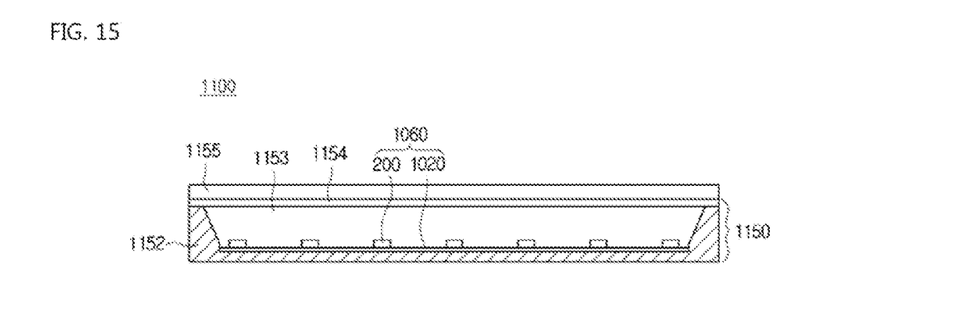
FIG. 15 is a perspective view showing the display device having the light emitting device according to the embodiment.

FIG. 15 is a view showing the display device having the light emitting device according to the embodiment.

Referring to FIG. 15, the display apparatus 1100 includes a bottom cover 1152, a substrate 1120 on which the light emitting devices 200 are arrayed, an optical member 1154, and a display panel 1155.

The substrate 1120 and the light emitting device 200 may constitute the light emitting module 1160. In addition, the bottom cover 1152, at least one light emitting module 1160, and the optical member 1154 may constitute the light unit 1150. The bottom cover 11152 may include a receiving part 1153, but the embodiment is not limited thereto. The light emitting module 1160 includes the substrate 1120 and a plurality of light emitting devices 200 arranged on the substrate 1120.

The optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate may be omitted. The diffusion sheet diffuses the incident light, the horizontal and vertical prism sheet concentrates the incident light onto the display panel, and the brightness enhanced sheet improves the brightness by reusing the lost light.

The optical member 1154 is provided on the light source module 1160. The optical member 1154 provides the light emitted from the light source module 1150 as a surface light source, or diffuses or concentrates the light.

Figure 16:
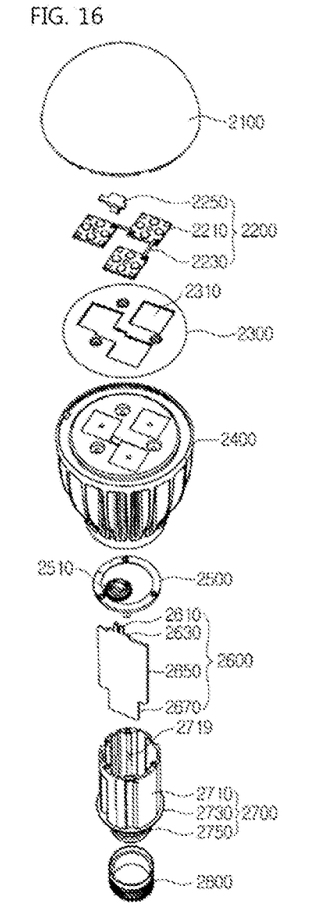
FIG. 16 is an exploded perspective view showing a lighting device having a light emitting device according to the embodiment.

FIG. 16 is an exploded perspective view showing a lighting device having the light emitting device according to the embodiment.

Referring to FIG. 16, the lighting device according to the embodiment may include a cover 2100, a light source module 2200, a radiator 2400, a power supply part 2600, an inner case 2700, and a socket 2800. The lighting device according to the embodiment may further include at least one of a member 2300 and a holder 2500. The light source module 2200 may include the light emitting device according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 2300 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting device according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives and radiates heats from the light source module 2200 and the power supply part 2600.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion of the power supply part 2600.

The power supply part 2600 processes or converts an electric signal received from the outside and provides the processed or converted electric signal to the light source module 2200. The power supply part 2600 is received in a receiving groove 2719 of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to the socket 2800.

The inner case 2700 may include a molding part therein together with the power supply part 2600. The molding part is prepared by hardening molding liquid, and the power supply part 2600 may be fixed inside the inner case 2700 by the molding part. The embodiment may prevent the metal contained in the light emitting device from being discolored. The embodiment may prevent the material constituting the light emitting device from being discolored due to the acrylic acid gas generated in the light emitting apparatus. The embodiment may improve the luminous intensity of the light emitting device. The embodiment may improve the optical reliability of the light emitting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting apparatus comprising:
 a plurality of light emitting devices spaced apart from each other;
 a substrate under the plurality of light emitting devices;
 a bonding member between each of the plurality of light emitting devices and the substrate;
 an adhesion member under a bottom surface of the substrate; and
 a support member under a bottom surface the adhesion member,
 wherein each of the plurality of light emitting devices comprises:
  a body having a cavity;
  a plurality of electrodes on the body;
  a light emitting chip on a first electrode of the plurality of electrodes and in the cavity;
  a paste member for bonding the light emitting chip to the first electrode in the cavity; and
  a molding member on the light emitting chip in the cavity,
 wherein the adhesion member includes at least one of benzotriazole and hydroxy group,
 wherein the substrate is electrically connected to the plurality of electrodes of the plurality of light emitting devices through the bonding member,
 wherein a material of the bonding member is different from a material of the adhesion member,
 wherein the bonding member is formed of an electrical conductivity material,
 wherein the substrate includes a support layer formed of metal, an insulating layer on the support layer, a circuit pattern on the insulating layer and a protective layer on the insulating layer,
 wherein the circuit pattern is disposed in the protective layer,
 wherein the insulating layer is disposed between the support layer and the circuit pattern,
 wherein the circuit pattern of the substrate includes a plurality of pads electrically connected to the bonding member,
 wherein the support layer has a thickness of 60% or more of a thickness of the substrate,
 wherein the thickness of the support layer is greater than a thickness of the insulating layer and the protective layer,
 wherein the adhesion member is disposed between the support layer of the substrate and the support member,
 wherein the support layer is a bottom layer of the substrate,
 wherein the support member and the support layer are electrically insulated from the light emitting device,
 wherein the support member is formed of a metal plate,
 wherein the adhesion member is adhered to the support layer and the support member,
 wherein an outer portion of the adhesion member is exposed between a lateral surface of the support layer and a lateral surface of the support member,
 wherein the light emitting device includes an LED chip,
 wherein the paste member is disposed between the light emitting device and the first electrode,
 wherein the adhesion member prevents the paste member from being discolored by acid, and
 wherein a thickness of the support member is greater than the thickness of the substrate.

2. The light emitting apparatus of claim 1, wherein the adhesion member includes a base layer and an adhesive layer on the base layer, the adhesive layer disposed on at least one of a top surface and a bottom surface of the base layer, and
 wherein at least one of the base layer and the adhesive layer includes the benzotriazole or the hydroxy group.

3. The light emitting apparatus of claim 2, wherein the adhesive layer includes a first adhesive layer disposed between the support layer of the substrate and the base layer, and a second adhesive layer between the bottom surface of the base layer and the support member,
 wherein the first and second adhesive layers include one of the benzotriazole and the hydroxy group, and
 wherein the support layer of the substrate directly contacts the first adhesive layer.

4. The light emitting apparatus of claim 2, wherein the base layer includes a resin material or a polymer material, and
 wherein the base layer includes one of the benzotriazole and the hydroxy group.

5. The light emitting apparatus of claim 1, wherein the adhesion member includes benzotriazole reactant, and
 wherein the adhesion member directly contacts a bottom surface of the support layer of the substrate and a top surface of the support member.

6. The light emitting apparatus of claim 1, wherein the hydroxy group includes 2-hydroxyethyl acrylate.

7. The light emitting apparatus of claim 6, wherein the adhesion member having the hydroxy group includes an acid free material.

8. The light emitting apparatus of claim 1, wherein the hydroxy group includes 2-hydroxethyl acetate.

9. The light emitting apparatus of claim 1, wherein the paste member includes a silver material.

10. The light emitting apparatus of claim 1, further comprising at least one of benzotriazole group material or hydroxy group material between the body and the paste member.

11. The light emitting apparatus of claim 1, wherein the protective layer comprises a solder resist layer and the support layer of the substrate directly contacts a top surface of the adhesion member, and
 wherein a top surface of the protective layer is exposed through the bonding member.

12. The light emitting apparatus of claim 1, wherein the adhesive member is formed of a high thermal conductivity tape and the support member is a heat dissipation plate.

13. The light emitting apparatus of claim 12, wherein the support member receives a part of a display device therein.

14. The light emitting apparatus of claim 1, wherein the substrate is a metal core PCB (Printed circuit board).

15. A light emitting apparatus comprising:
a plurality of light emitting devices, each light emitting device comprising:
   a body;
   a plurality of electrodes on the body;
   a light emitting chip on a first electrode of the plurality of electrodes;
   a paste member disposed between the light emitting chip and one of the plurality of electrodes; and
   a molding member disposed on the light emitting chip and the paste member;
a substrate disposed under the light emitting devices and having a circuit pattern electrically connected to the light emitting device;
an adhesion member including a first adhesive layer under a bottom surface of the substrate and a base layer under a bottom surface of the first adhesive layer; and
a support member under a bottom surface of the adhesion member,
wherein the first adhesive layer includes one of benzotriazole and hydroxy group,
wherein the circuit pattern of the substrate is electrically connected to the light emitting devices through a bonding member,
wherein a material of the bonding member is different from a material of the first adhesive layer,
wherein the substrate includes a support layer formed of metal, an insulating layer on the support layer, the circuit pattern on the insulating layer and a protective layer on the insulating layer,
wherein the circuit pattern is disposed in the protective layer,
wherein the insulating layer is disposed between the support layer and the circuit pattern,
wherein the circuit pattern of the substrate includes a plurality of pads electrically connected to the bonding member,
wherein the support layer having the metallic material has a thickness of 60% or more with respect to a thickness of the substrate,
wherein the thickness of the support layer is greater than a thickness of the insulating layer and the protective layer,
wherein the first adhesive layer of the adhesion member contacts the support layer of the substrate and the base layer of the adhesion member,
wherein the support member and the support layer of the substrate electrically are insulated from the light emitting device,
wherein the support layer is a bottom layer of the substrate,
wherein the support member is formed of a metal plate,
wherein the adhesion member is adhered to the support layer and the support member,
wherein an outer portion of the adhesion member is exposed between a lateral surface of the support layer and a lateral surface of the support member,
wherein the light emitting device includes an LED chip which emits light,
wherein the adhesion member prevents the paste member from being discolored by acid, and
wherein a thickness of the support member is greater than the thickness of the substrate.

16. The light emitting apparatus of claim 15, wherein the base layer includes a resin material or a polymer material,
wherein the base layer includes one of benzotriazole and hydroxy group, and
wherein the support layer of the substrate directly contacts the first adhesive layer.

17. The light emitting apparatus of claim 16, wherein the adhesion member includes a second adhesive layer under the base layer,
wherein the base layer directly contacts the first adhesive layer and the second adhesive layer, and
wherein the second adhesive layer includes one of benzotriazole and hydroxy group.

18. The light emitting apparatus of claim 17, wherein the paste member is bonded to at least one of the electrodes of the light emitting chip, and
wherein the electrodes and the paste member include a silver material.

19. The light emitting apparatus of claim 15, further comprising at least one of benzotriazole group material or hydroxy group material between the body and the paste member.

20. The light emitting apparatus of claim 15, wherein the support member receives a light guide plate corresponding to one side of the light emitting devices.

* * * * *